United States Patent
van de Beek et al.

(10) Patent No.: US 7,671,615 B2
(45) Date of Patent: Mar. 2, 2010

(54) METHOD AND APPARATUS FOR CONTROLLING THE TEMPERATURE OF ELECTRONIC COMPONENTS

(75) Inventors: Carel van de Beek, Eindhoven (NL); Stefan Kreissig, Venusberg (DE); Volker Hansel, Dresden (DE); Sebastian Giessmann, Dresden (DE); Frank-Michael Werner, Dresden (DE); Claus Dietrich, Thiendorf (DE); Jorg Kiesewetter, Thiendorf (DE)

(73) Assignee: SUSS MicroTec Tech Systems GmbH, Sacka (DE)

( * ) Notice: Subject to any disclaimer, the term of this patent is extended or adjusted under 35 U.S.C. 154(b) by 0 days.

(21) Appl. No.: 11/839,899

(22) Filed: Aug. 16, 2007

(65) Prior Publication Data

US 2008/0042679 A1    Feb. 21, 2008

(30) Foreign Application Priority Data

Aug. 16, 2006   (DE) .................. 10 2006 038 457

(51) Int. Cl.
*G01R 31/02*    (2006.01)
(52) U.S. Cl. .................................... 324/760
(58) Field of Classification Search ......... 324/760–765
See application file for complete search history.

(56) References Cited

U.S. PATENT DOCUMENTS

| | | | |
|---|---|---|---|
| 5,084,671 A * | 1/1992 | Miyata et al. ............... 324/760 |
| 6,468,098 B1 * | 10/2002 | Eldridge ..................... 439/197 |
| 7,023,227 B1 | 4/2006 | Wong | |
| 7,046,025 B2 * | 5/2006 | Schneidewind et al. ..... 324/760 |
| 7,091,733 B2 * | 8/2006 | Takekoshi et al. ........... 324/760 |
| 7,177,007 B2 * | 2/2007 | Emoto ......................... 355/30 |
| 7,242,206 B2 * | 7/2007 | Takekoshi et al. ........... 324/760 |
| 2003/0155939 A1 * | 8/2003 | Lutz et al. ................... 324/760 |
| 2004/0032272 A1 * | 2/2004 | Maruyama et al. .......... 324/754 |
| 2006/0158207 A1 * | 7/2006 | Reitinger .................... 324/760 |

FOREIGN PATENT DOCUMENTS

| DE | 10246282 A1 | 4/2004 |
|---|---|---|
| DE | 102004040527 B3 | 3/2006 |

\* cited by examiner

*Primary Examiner*—Ha Tran T Nguyen
*Assistant Examiner*—Richard Isla Rodas
(74) *Attorney, Agent, or Firm*—Heslin Rothenberg Farley & Mesiti P.C.; Victor A. Cardona, Esq.

(57) ABSTRACT

In a method and an apparatus for measuring temperature-controlled electronic components in a test station, a component to be measured is held and positioned using a chuck, has a temperature-controlled and directed fluid flow applied to it and is electrically contact-connected using probes and is measured. The setting of the temperature of the component to the temperature at which the measurement is intended to be carried out is effected solely using a directed fluid flow at a defined temperature.

25 Claims, 2 Drawing Sheets

METHOD AND APPARATUS FOR CONTROLLING THE TEMPERATURE OF ELECTRONIC COMPONENTS

BACKGROUND OF THE INVENTION

The invention relates to a method and an apparatus for measuring temperature-controlled electronic components in a test station.

For testing a electronic component, herein also referred to as component, to be measured is positioned relative to probes, mostly by moving the component which is arranged on a chuck in order to subsequently electrically contact the component by probes placed on contact areas of the components. Herein after, electrically contacting the component by probes is referred to as contacting. The probes are used to feed in or tap off any signals, for example optical, electrical or mechanical signals. In the case of, for example, optoelectronic components whose radiation behavior in the relevant spectral range is measured, it is necessary to ensure an optical path for feeding in or tapping off optical signals. In the case of components which are still in the wafer assembly, the radiation source or the radiation input is arranged on a side other than that of the contact areas, with the result that it may also be necessary for the components to be accessible from both sides during the measurement. The measurement of other components, for example pressure-sensitive components, also occasionally makes it necessary for said components to be accessible from both sides in the measuring arrangement.

Components which may be present both in the wafer assembly and in singulated form and, if appropriate, in the already finally assembled form are measured for the purposes of functional testing or burn-in. It is known that said measurements are carried out in a wide temperature range, for example between −60° C. and +200° C., in accordance with their application parameters. In individual cases, even higher temperatures may be required.

SUMMARY OF THE INVENTION

The methods and apparatuses for carrying out any method are described below. Those allow measurements of components which are to be cooled or heated wherein the components are accessible from both sides. Cooling and heating are not electrically effected, which results in that the measurement is not electromagnetically influenced. The influence of an optical signal to or from the component can also be prevented or at least reduced in embodiments of the apparatus and method.

The measurement temperature of the component can be reproduced and, in the case of unpackaged components, can be set in a very rapid manner since the heat exchange between the fluid and the component can be very well defined and regulated. Definition and regulation of the heat exchange can be effected by e.g. the choice of fluid, the flow temperature of the latter, i.e. the difference between the temperature of the fluid and the temperature of the component to be set, or the flow velocity and heat exchange action time. The two latter parameters can be regulated in real time. On the other hand, there is good heat exchange between the fluid and the component on account of the defined flow velocity. The setting time which is usually necessary can also be reduced since only the temperature of the component is essentially controlled.

In addition to the measurement task which may also provide active cooling during measurement, for example, the choice of fluid also depends on the component, the feeding-in and tapping-off of the signals and on the further measurement environment. On account of its simple handling, air or another gas will thus be used in many applications. However, liquid can also be used if the electrical contacts are insulated or spatially separated from the fluid flow, in which case the higher heat capacity of the latter can be used, thus requiring smaller amounts of fluid for the same temperature difference.

BRIEF DESCRIPTION OF THE DRAWINGS

The invention shall be explained in more detail below using exemplary embodiments. In the associated drawing, in each case in a diagrammatic illustration.

DETAILED DESCRIPTION OF THE INVENTION

Figure 1:
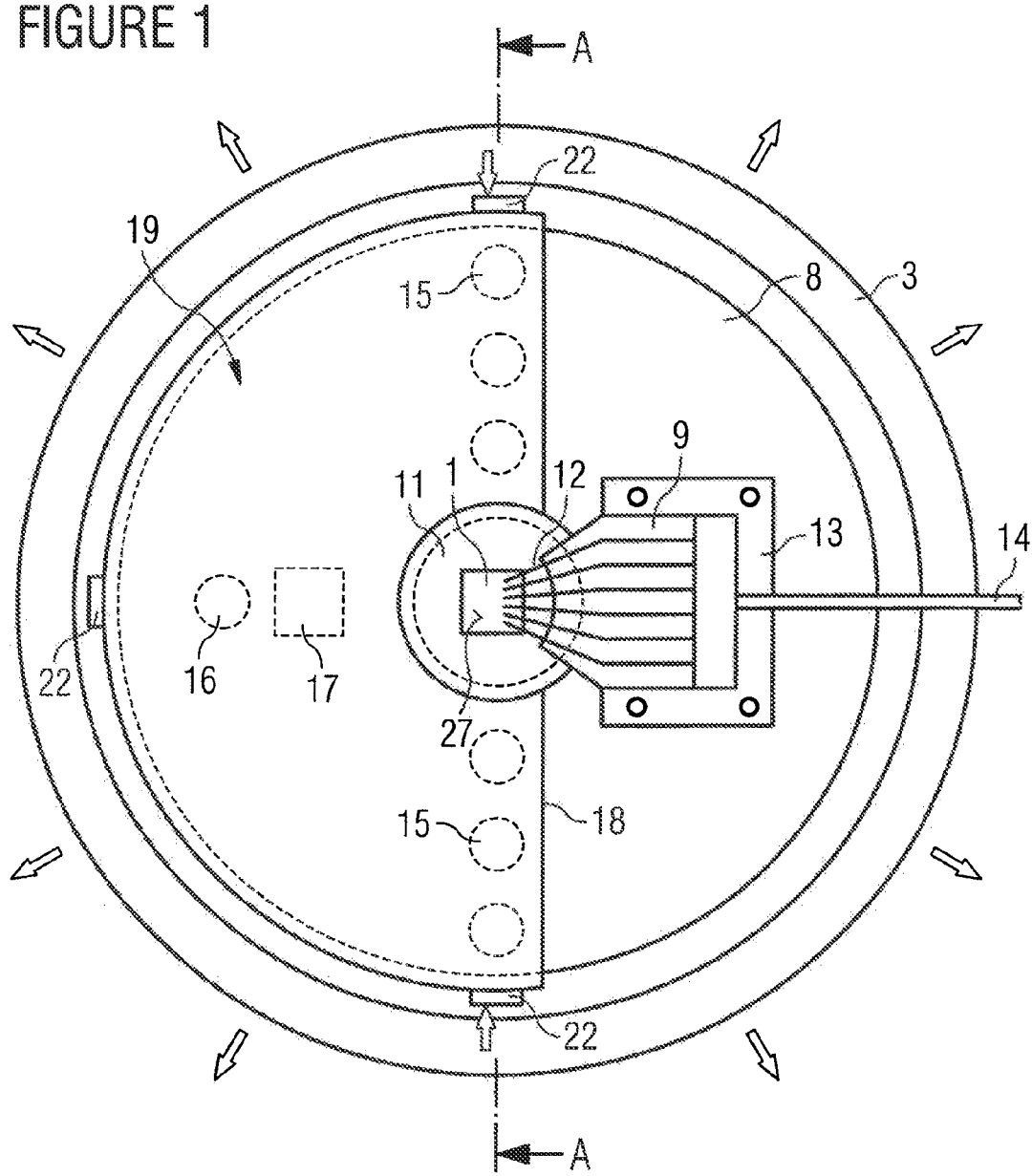
FIG. 1 shows a measuring arrangement having contact needles and a flow device which is arranged above a plurality of components.

According to one embodiment of the invention, there is good heat exchange between the fluid and the component if the flow is directed in such a manner that it is directed parallel to the top side or underside or parallel to both sides of the component. With flow on both sides, it is possible, on the one hand, to increase the heat exchange area and, on the other hand, to keep the flow laminar by restricting the flow velocity. It goes without saying that this depends on the surface structure of the component, but the laminar flow can be realized, if necessary, at least in sections.

Furthermore, temperature control can be effected in a very targeted manner using the configuration of the flow device, that is to say with adjacent components being influenced to a considerably lesser extent. When nozzles are arranged in the flow device in which the flow is generated, the number, shape and diameter of said nozzles can thus be varied. The configuration of the nozzles is particularly relevant when, according to another embodiment of the invention, the flow is directed at the top side or underside or at both sides of the component approximately at a right angle, a deviation from this orientation being possible depending on the measuring arrangement of the flow device, on the component mounting or on the probes.

The configuration of the nozzles of the flow device can be used, for example, to set whether the temperature of one or more components is to be simultaneously controlled. Adaptation to the gaseous or liquid fluid is also possible using the configuration of the nozzles. For example, a virtually uniform flow over the entire surface of the component, which can effectively flow away to the side, can thus be achieved with a relatively large circular opening or a targeted jet for multipart surface structures can be achieved using very small nozzles.

Setting the temperature using a fluid flow which is directed at the component also allows the component to be freely accessible, in particular, since the support surfaces can be reduced to such a size and shape that it is ensured that the component is mounted on the chuck. In this case, the support surface can be reduced further using force-fitting mounting, that is to say clamping or tensioning. The mounting of the component primarily depends on the assembly state in which it is to be measured, that is to say whether the component is in the wafer assembly, has already been singulated, has been intermediately assembled, for example on a carrier substrate, has been partially assembled or has been finally assembled.

A wide variety of mounts which keep the wafer, the carrier substrate or the component supported only in the edge region or in sections so that optical, electrical or pressure signals can be applied or tapped off from the support side are known for these or other assembly states of the components and for different signals.

In different embodiments of the method and the apparatus, in which the fluid flow is directed at the top side of the component and in which the electrical contact is also effected on this side, the setting of the measurement temperature and the electrically contacting can be separated both temporally and spatially from the measurement of the component by controlling the temperature of the component using a fluid flow. For example, the temperature of the component is first of all controlled from the top side and the component is then contacted and measured.

In this manner, the probes, the fluid and the flow parameters can be selected virtually independently of one another in accordance with the measurement task to be realized without the flow influencing the measurement results. This could be the case, for example, if a strong flow is realized with a directional component at right angles to the orientation of the probes.

Temperature control and contacting are spatially separated, in one embodiment of the method, by virtue of the temperature of one of a plurality of components, which are arranged next to one another either in the wafer assembly or on a common carrier substrate or in some other manner, being controlled using the fluid flow, while a further component which has already been set to the measurement temperature is contacted and measured. This means that the flow device is positioned above a component other than that which the probes contact or a probe is not placed onto a component at which the fluid flow is directed. The temperature of the entire component arrangement can thus be successively controlled and the entire arrangement can be successively contact-connected by going over it in the manner of a grid. In order to compensate for the time sequences which may differ from one another for the two operations, the temperature of a plurality of components may also be controlled or a plurality of components may also be measured at the same time in addition to the fluid stream being regulated using the possibilities described above. Temperature control of a component which lasts for a relatively long time can thus be compensated for by virtue of the fluid flow simultaneously including a plurality of components and each component being gradually heated or cooled to the required measurement temperature in a plurality of successive incremental steps.

Controlling the temperature of the components in a targeted manner using a fluid flow which is directed at the top side of the latter is possible, for example, using one or more nozzles which are arranged in an area which extends essentially parallel to the surface of the component. According to one embodiment of the apparatus, this nozzle is the outlet of a housing that is arranged above the component, since this makes it possible to produce a uniform stream of fluid onto the component and, in addition, a fluid build-up above the component, in which, for example, the temperature of the fluid that is directly adjacent to the component can be determined. In addition, a plurality of nozzles which are used to gradually control the temperature of a plurality of components may be arranged in this area.

In other embodiments of the method and the apparatus, the temperature of the component is controlled via its underside, the above-described advantages, effects and configurations also being able to be applied to these embodiments. It goes without saying that it is also possible to direct a fluid flow both at the top side and at the underside of the component.

In other embodiments, the operation of controlling the temperature of the component via its underside can also be carried out indirectly by using the fluid flow to control the temperature of a plate. In this case, the components are in thermal contact with this plate. It goes without saying that this plate has at least acceptable heat transfer properties. In addition, a fluid flow may also be applied to the top side of the component.

In a comparable manner to applying the fluid flow to the top side of the component in a targeted manner, it is also possible in these embodiments of the method to control the temperature of individual components from a relatively large number of components in a targeted manner by applying the fluid flow only to sections of the plate. In this case, it can either be accepted that heat will also be simultaneously exchanged with adjacent components or the conduction of heat in the plate will be reduced by the choice of material or by patterning of the plate. For example, in one variant, the fluid flow flows through a pair of plates comprising the upper plate, which was described above and on which the component is or components are arranged, and a second plate which is arranged at a distance from and parallel to the first plate. This makes it possible to produce a limited fluid flow, which can be effectively regulated, parallel to the underside of the component, said fluid flow additionally being able to control the temperature of sections of the upper plate and the components positioned there above the latter by virtue of the arrangement of channels between the two plates, for example.

The flow device which can be used to realize such a fluid flow and is constructed from these two plates has a controlled inflow and a controlled outflow which are both dimensioned in such a manner that the fluid flows through the volume uniformly. This apparatus can likewise be used to produce a laminar flow which allows good heat transfer between the fluid and the upper plate. In particular, the fluid flow which spreads past the entire upper plate is used to ensure that the temperature of this plate is controlled in a very uniform manner even if the plate comprises a material with poor thermal conductivity. Therefore, this application can also be used when the configuration of the two plates from glass or from another material that is transparent for a defined spectral range realizes an optical path to the underside of the component. A support surface whose temperature has been controlled in this manner does not have an electromagnetic interference source generated by temperature control and allows optical signals in the wavelength range from ultraviolet to middle infrared radiation.

This optical path is used to apply radiation of a defined wavelength range to optoelectronic components or to receive such a signal and allows testing both of those components which themselves emit radiation under electrical control and those which are excited optically and convert these optical signals into electrical signals. In this case, the radiation source or the radiation input is usually directed at this flow device and electrical contact-connection is effected from the remote top side of the component.

The optical path also allows the optoelectronic components to be inspected during measurement. This is of particular interest in the case of microsystem elements having mechanical components, both mechanical-electrical microsystem elements (MEM systems) and mechanical-optical-electrical microsystem elements (MOEM systems). The deflection of a membrane from its position of rest may thus be observed, for example.

The configuration of the optical path essentially depends on the detector used. Just a bore in the receiving plate of the chuck may thus suffice for a glass fiber, for example. A relatively large, freely accessible area is required when using a large-area detector or an Ulbricht sphere. In other embodiments described above, an optical path is also realized when a wafer is held only in the edge region and has a freely accessible area towards the bottom.

If the temperature of the components is controlled and the components are measured in the wafer assembly, the wafer can also replace the upper plate in the described pair of plates if its support is configured to be impervious to the liquid. In this case too, the optical path can be realized if the lower plate comprises transparent material, the reduction in the number of interfaces along the optical path being able to be proven to be advantageous.

In order to regulate temperature control by changing the fluid stream, that is to say its velocity, its temperature and its quantity, it is possible, in other configurations, to measure the temperature of the component or the temperature of the fluid stream or both using suitable temperature sensors. Such measurement of the temperature of the fluid stream, which ensures that the latter is regulated, can be carried out using a reference component whose thermal behaviour is comparable to that of the components to be measured, in particular on account of its size, structure and material, and which is arranged at a comparable location in the fluid stream. For this purpose, it is possible, on the basis of the position of the reference component, to either directly infer the temperature of the component to be measured or to establish a reproducible relationship between the two components by means of calibration. In addition, it is also possible to determine the temperature of the components directly using the known thermal behaviour of the diodes contained in each component.

Figure 2:
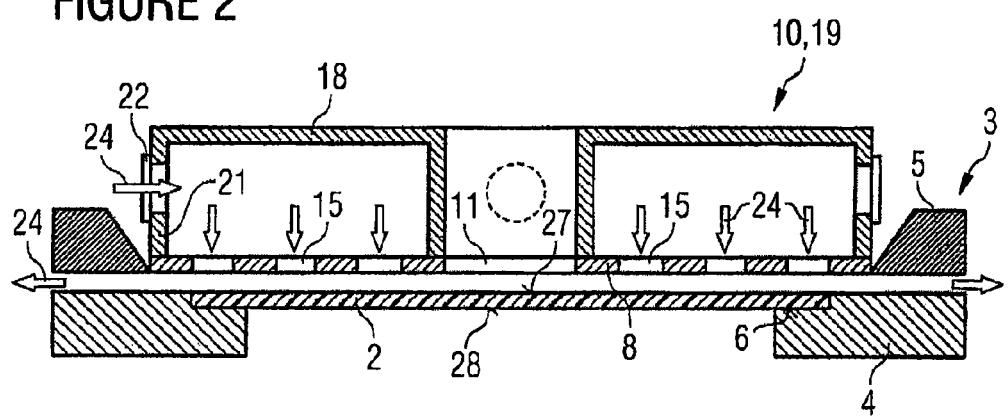
FIG. 2 shows the measuring arrangement shown in FIG. 1 in a sectional illustration with the section line A-A.
Figure 3:
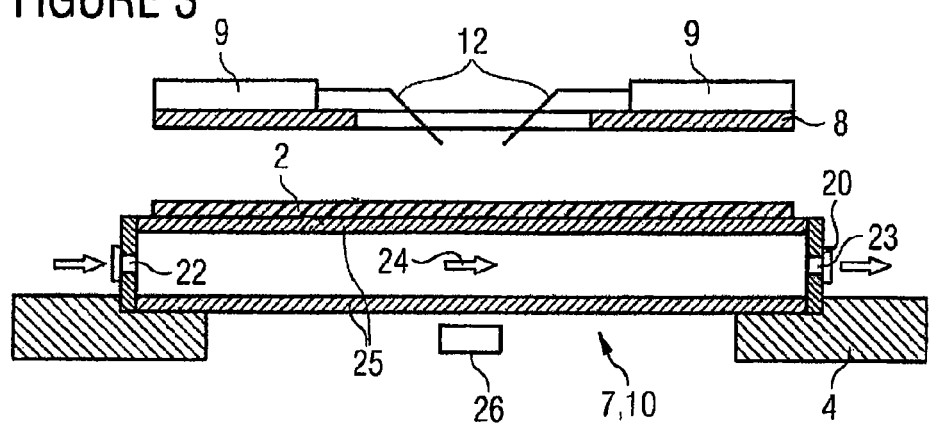
FIG. 3 shows a measuring arrangement having contact needles and a flow device which is arranged under a plurality of optoelectronic components.

The measuring arrangements shown in FIGS. 1 to 3 are used to measure components 1 which are either still in the wafer assembly or have been singulated and temporarily fixed to a wafer-like carrier substrate 2 in the form of a grid. If the text below refers to a wafer, the arrangements of components on such a carrier substrate which are comparable to this are also intended to be included.

The chucks 3 illustrated in FIGS. 1 to 3 comprise a wafer holder 4 and a probe support 5, which can both be moved relative to one another within the plane which coincides with the plane of the drawing (X-Y plane) in the Z direction perpendicular to the latter using a positioning device (not illustrated in any more detail) and can be oriented at the angle theta with respect to one another.

The wafer holder 4 of the chucks 3 from FIGS. 1 to 3, which can be positioned in the X-Y plane, in the Z direction and at an angle, always has an annular support surface 6 on which the wafer 2 can be directly placed or on which a receiving plate 7 of the chuck 3 (add-on plate) for receiving the wafer 2 can be respectively placed in the edge region and can be fixed using means which are not illustrated in any more detail. The probe support 5 of the chuck 3 comprises a probe holder plate 8 for receiving the probes 9 and needs to be positioned in the Z direction in order to lower the probes 9 in the Z direction onto the component 1 to be measured, after the wafer 2 has been positioned in the X-Y plane and following rough positioning in the Z direction, in such a manner that the probes 9 contact-connect the contact areas of the component 1.

In the measuring arrangement shown in FIG. 1 and FIG. 2, a wafer 2 is placed and fixed on the annular support surface 6 of the wafer holder 4. The annular support surface 6 makes it possible to freely access the underside of the wafer 2, with the result that this arrangement can be used, for example, to measure optoelectronic components 1 with a radiation source on the underside. An optical sensor which is not illustrated in any more detail and is arranged under the wafer 2 is used to receive the light that is emitted by the individual component 1 on account of its electrical excitation.

The probe holder plate 8 which is approximately the size of a wafer 2 and, in the exemplary embodiment, is used both as part of a flow device 10 and as a probe mount is arranged on the probe support 5 at a distance from the wafer 2 and parallel to the latter.

The probe holder plate 8 has a central passage 11 through which an individual component 1 of the wafer 2 can be electrically contact-connected. Contact-connection is effected using a plurality of needles 12 of a probe 9 which are arranged relative to one another in a manner corresponding to the arrangement of the contact areas of the component 1. The probe 9 is mounted on the probe holder plate 8 using a mount 13 and is connected to an evaluation unit (not illustrated) using a cable 14.

The probe holder plate 8 has further passages which are uniformly arranged on both sides of the central passage 11 at a diameter of the probe holder plate 8. These further passages are used as an outlet 15 for a fluid. Arranged on the underside, that is to say the side opposite the wafer 2, of that half of the probe holder plate 8 which does not comprise the probe 9 is a reference component 17 which has been singulated, whose thermal behaviour is comparable to that of the components 1 of the wafer 2 and which is provided with a temperature sensor (not illustrated in any more detail). The probe holder plate 8 has a further outlet, the reference outlet 16, in the immediate vicinity of the reference component 17.

That region of the probe holder plate 8 which comprises the outlets 15, which are arranged on both sides of the central passage 11, and the reference component 17 is covered by a cover 18 in such a manner that at least the central passage 11 and the probe 9, including its mount 13, are not enclosed. The cover 18 is formed by a top surface 20, which is arranged parallel to the probe holder plate 8, and an encircling lateral surface 21, with the result that the cover 18 and that section of the probe holder plate 8 which is covered by it form a housing 19. Three entry connection pieces 22 which can be closed and can be used, either individually or together, to let a fluid into the housing 19 are arranged such that they are distributed in the lateral surface 21.

In order to control the temperature of the component 1 to be measured, this component 1 is positioned under one of the outlets 15. A temperature-controlled fluid, air in the exemplary embodiment, is then blown into the housing 19 through one of the entry connection pieces 22. The air flows through the outlets 15 in the direction of the components 1 of the wafer 2 and escapes between the wafer 2 and the probe holder plate 8 with a flow parallel to the surface of said components, as is indicated in FIG. 2 using the flow arrows. The flow velocity can be set, in particular, using a higher pressure of the air which is blown in. Alternatively, the air can also be blown in through a plurality of entry connection pieces 22.

The measurement temperature at the first component 1 can be achieved either by positioning said component under an outlet 15 in the immediate vicinity of the central passage 11 for a relatively long time or by gradually heating it by first of all positioning this component 1 under the outlet 15 which is furthest away and successively positioning it under each further outlet 15 in the direction of the central passage 11 in a regular cycle and exposing it to the air flow 24. This cycle is defined by the period of time during which a component 1 whose temperature has been initially controlled under the chain of more remote outlets 15 is heated to the final measurement temperature under the last outlet 15. All of the components 1 of the wafer 2 are thus gradually preheated with a cyclical feed, set to the measurement temperature and then contact-connected and measured.

The temperature of the air which, in the exemplary embodiment, is intended to heat the selected component 1 to 70° C. is controlled to 100° C. It goes without saying that these temperatures are only exemplary values and must be determined for each measurement task according to the thermal behaviour of a component and the specific fluid flow 24 to be set. The component 1 under each outlet 15 is primarily heated by the air flow 24 which is directed at the component 1 in a perpendicular manner. The adjacent components 1 are also already heated by the parallel air flow 24 of escaping air, with the result that the sudden change in temperature when the temperature-controlled air flow 24 impinges on a component 1 is kept in a range which is harmless even for very small structures of the component 1 and which reduces the temperature difference inside the wafer 2. This shortens the operation of controlling the temperature of the components 1 and reduces disruptive stresses in the wafer 2.

As soon as the selected component 1 has reached the measurement temperature, it is positioned under the probe 9 using the positioning device of the chuck 3 and the needles 12 of the probe 9 are lowered onto its contact areas. On account of the fact that the outlets 15 are arranged along a diameter of the probe holder plate 8 whose size is approximately the same as that of the wafer 2, the temperature of the components 1 of the wafer 2 which are on a meandering feed path, for example, is repeatedly initially controlled. The initial temperature control is determined by the number of outlets 15 along the feed path and the complexity of the movement sequence, with the result that it is possible to change the initial temperature control by changing the number and arrangement of outlets 15.

On account of the spatial separation between the electrical contact-connection and the air flow 24, it is not necessary to interrupt the air flow 24 during contact-connection and measurement. With a continued air flow 24, the next components 1 to be measured are continuously set to the measurement temperature and the more remote components 1 are preheated. However, an interruption may be appropriate in particular cases.

As a result of the fact that the air flow 24 escapes laterally between the probe holder plate 8 and the wafer 2, that region of the central passage 11 in which the selected component 1 is contact-connected and measured is also covered by this secondary flow. This may be used to heat the probe 9 without exposing it to a direct flow. In another embodiment, a secondary flow in the direction of the probes may be prevented to the greatest possible extent using targeted suction.

The reference outlet 16 in the immediate vicinity of the reference component 17 allows the temperature which has been set to be estimated. If it is necessary to accurately measure the temperature during final setting of the measurement temperature or during contact-connection, it may also be directly measured at the component 1 in question using suitable sensors. It is also possible to use a temperature sensor in the vicinity of the component 1, which has been set to the measurement temperature, in the build-up of fluid flowing onto the component 1 in a perpendicular manner.

It is obvious that this embodiment can also be used with another, possibly even liquid, fluid and can be used to cool the components 1. It is also possible to supplement the fluid, which is directed at the top side of the component 1, with a fluid flow 24 along the underside of the wafer 2 or with a fluid flow 24 which is directed at the entire wafer 2 or at specific regions of the latter and is directed at the underside of said wafer approximately at a right angle using one or more nozzles (not illustrated). In this case too, the choice of flow direction and the section of the wafer 2 to which the flow is applied depend, for example, on the type of components 1, on the temperature to be set and on other measurement parameters.

FIG. 3 shows another embodiment of the measuring apparatus in which a continuous fluid flow 24 indirectly controls the temperature of the components 1 using a special add-on plate 7. For this purpose, the add-on plate 7 comprises two parallel plates 25 which are the same size and are surrounded by a lateral surface 21. The lateral surface 21 in turn has a plurality of closable entry connection pieces 22 and exit connection pieces 23. The fluid (water in this exemplary embodiment) which has been heated or cooled to a determined flow temperature is introduced in a pressurized manner into the volume of the add-on plate 7 through one or else more entry connection pieces 22 and flows away again via at least one exit connection piece 23. In this case too, a uniform fluid flow 24 with little swirl can be ensured by selecting the position and number of entry connection pieces 22 and exit connection pieces 23 in order to uniformly control the temperature of the components 1 on the add-on plate 7. The flow velocity of the fluid flow 24 can be set using the pressure. In this embodiment too, another, even gaseous, fluid can be used instead of water. In another embodiment, the interior of the add-on plate 7 can be subdivided into a plurality of channels, for example parallel channels (not illustrated), into which a fluid or differently temperature-controlled fluid is introduced jointly or individually. In this manner, the temperature of the wafer 2 can also be controlled in sections and in a staggered manner.

In the exemplary embodiment, the two plates 25 of the add-on plate 7 comprise glass, with the result that radiation emitted by the undersides of the components 1 of the wafer 2 on the add-on plate 7 can be recorded using a detector 26. The distance between the two plates 25 of the add-on plate 7 can be kept very small by using water, which has a high heat capacity, as the fluid, with the result that the detector 26 can be positioned close to the emission source of the component 1. In this embodiment, the type of fluid also depends on the radiation which must penetrate the add-on plate 7 through which the fluid flows. In particular, water transmits UV radiation in a very effective manner. Another material which transmits at this wavelength, for example sapphire as well, can be used instead of the glass plates, likewise on the basis of the wavelength of the radiation but also on the basis of the temperature.

The individual components 1 of the wafer 2 are contact-connected and measured in the known manner, after their temperature has been controlled, by virtue of the probes 9, which are held by a probe holder plate 8, being lowered onto the contact areas of the components 1 on the add-on plate 7, which has previously been positioned relative to the probes, and the signal being applied to said components.

The invention claimed is:

1. A method for measuring temperature-controlled electronic components, said method comprising the steps of:

holding and positioning a component using a chuck, said component having a top side on which contact areas of the component are arranged in order to electrically contact-connect the component, and an underside opposite the top side;

setting said component to a measurement temperature, at which a measurement is intended to be carried out, the component set to the measurement temperature by controlling the temperature of the underside using a fluid flow which has been set to a defined temperature and flows adjacent the component;

electrically contact-connecting said component using probes and measuring the component after the measurement temperature has been set;

wherein the underside of the component is brought into thermal contact with a plate and the fluid flow is applied to the plate; and wherein an optical signal is fed into the temperature-controlled component to be measured or is received by the component through said plate and said plate is transparent in a defined wavelength range.

2. The method according to claim 1, wherein temperature of the underside of the component is controlled using a lower fluid flow.

3. The method according to claim 1, wherein the fluid flow is directed at one of the sides of said component substantially at a right angle.

4. The method according to claim 3, wherein the fluid flow is also additionally directed at another side of the component substantially at a right angle.

5. The method according to claim 1, wherein the fluid flow is directed substantially parallel to one of two sides of said component.

6. The method according to claim 5, wherein the fluid flow is additionally also directed substantially parallel to another of the two sides of said component.

7. The method according to claim 5, wherein the fluid flow is laminar along an entire extent of the component.

8. The method according to claim 1, wherein step b) is continued while the component is being contact-connected and measured.

9. The method according to claim 1, wherein the component is first set to the measurement temperature by applying the fluid flow to the top side of the component and the component is then electrically contact-connected and measured.

10. The method according to claim 9, wherein a plurality of components are arranged beside one another, the fluid flow are applied to at least one of said components, while a further component whose temperature has previously been controlled is electrically contact-connected and measured.

11. The method according to claim 1, wherein the fluid flow is applied to sections of said plate.

12. The method according to claim 1, wherein the underside of the component is brought into extensive thermal contact with an upper plate of two parallel plates and the fluid flow runs between the two plates.

13. The method according to claim 1, wherein the fluid flow is applied to a reference component, whose thermal behaviour is comparable to that of the component and which has a temperature sensor, at a same time as it is applied to said component.

14. The method according to claim 1, wherein the temperature of the fluid flow is measured.

15. An apparatus for controlling temperature of and measuring electronic components in a test station, said apparatus comprising:
a chuck for receiving and positioning electronic components,
a component of said electronic components having a top side on which contact areas of said component are arranged in order to electrically contact-connect said component, and an underside opposite the top side;
at least one probe for electrically contact-connecting said component;
said chuck comprising a transparent plate for thermally contacting the underside
at least one flow device for generating a temperature-controlled and directed fluid flow to said plate adjacent said component;
the at least one probe and the at least one flow device being able to be positioned relative to the component in a spatially separated manner; and
said chuck configured to receive said component so as to allow optical access for transmitting radiation to said underside of said component.

16. The apparatus according to claim 15, wherein the components are arranged in a wafer assembly or a plurality of singulated components being arranged on a receiving surface of the chuck, and the at least one flow device is positioned with respect to a component other than a component selected for contacting.

17. The apparatus according to claim 15, wherein the at least one flow device comprises a housing having an inlet for supplying a fluid, having an outlet nozzle and having a side surface which can be positioned substantially parallel to a top side or an underside of the component, and the outlet nozzle is situated in the side surface.

18. The apparatus according to claim 15, wherein the chuck comprises a plate construction held only in an edge region and comprising two plates which are arranged essentially parallel to one another and at a distance from one another as well as a flow device such that a temperature-controllable fluid flows between the two plates at a defined speed.

19. The apparatus according to claim 18, wherein channels through which the fluid can flow independently are arranged in the flow device.

20. The apparatus according to claim 18, wherein an upper plate of the plate construction are formed by a wafer or wafer-like structure.

21. The apparatus according to claim 15, wherein the chuck defines an optical path for transmitting radiation of a defined wavelength range to the underside of the component.

22. The apparatus according to claim 15, wherein a reference component whose temperature can be controlled using the fluid flow is arranged with a temperature sensor in order to detect temperature of the reference component.

23. The apparatus according to claim 15, wherein a temperature sensor is arranged to detect temperature of the fluid flow.

24. A system for controlling temperature of and measuring electronic components in a test station, said system comprising:
a chuck receiving and positioning an electronic component, said component having a top side electrically contact-connected to a probe, said component having an underside opposite the top side;
said chuck comprising a transparent plate in thermal contact with the underside;
at least one flow device for generating a temperature-controlled and directed fluid flow to said plate adjacent said component;
said probe and said at least one flow device positioned relative to the component in a spatially separated manner;
said chuck receiving said component such that said underside of said component is optically accessible through an optical path in the plate allowing transmission of radiation to said underside.

25. The system of claim 24 wherein said plate is transparent to define said optical path to the underside of said component.

* * * * *